(12) United States Patent
Pitney

(10) Patent No.: US 8,340,801 B2
(45) Date of Patent: *Dec. 25, 2012

(54) SYSTEMS FOR GENERATING REPRESENTATIONS OF FLATNESS DEFECTS ON WAFERS

(75) Inventor: John A. Pitney, St. Peters, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 508 days.

This patent is subject to a terminal disclaimer.

(21) Appl. No.: 12/648,620

(22) Filed: Dec. 29, 2009

(65) Prior Publication Data

US 2011/0160891 A1 Jun. 30, 2011

(51) Int. Cl.
G06F 19/00 (2011.01)

(52) U.S. Cl. ............... 700/110; 700/105; 702/36

(58) Field of Classification Search .......... 700/105, 700/108, 109, 110, 121; 702/35, 36, 81, 702/82, 83, 84, 182, 183, 184; 438/14, 16, 438/17, 33, 110, 113, 460
See application file for complete search history.

(56) References Cited

U.S. PATENT DOCUMENTS

| | | | |
|---|---|---|---|
| 6,583,050 B2 | 6/2003 | Wenski et al. | |
| 7,230,680 B2 | 6/2007 | Fujisawa et al. | |
| 7,324,917 B2 | 1/2008 | Koliopoulos et al. | |
| 7,330,042 B2 | 2/2008 | Fukazawa et al. | |
| 7,343,583 B2 | 3/2008 | Keck et al. | |
| 7,346,883 B2 | 3/2008 | Keck et al. | |
| 7,365,830 B2 | 4/2008 | Fujisawa et al. | |
| 7,455,785 B2 | 11/2008 | Koike et al. | |
| 7,474,386 B2 | 1/2009 | Fujisawa et al. | |
| 7,659,207 B2 | 2/2010 | Schauer et al. | |
| 8,165,706 B2 * | 4/2012 | Pitney | 700/110 |
| 2003/0023402 A1 | 1/2003 | Kobayashi et al. | |
| 2004/0252879 A1 | 12/2004 | Tiemeyer et al. | |
| 2009/0016595 A1 | 1/2009 | Peterson et al. | |
| 2011/0160891 A1 | 6/2011 | Pitney | |

FOREIGN PATENT DOCUMENTS

EP 1335420 A1 8/2003

* cited by examiner

*Primary Examiner* — Charles Kasenge
(74) *Attorney, Agent, or Firm* — Armstrong Teasdale LLP

(57) ABSTRACT

Systems and computer-readable media having computer-executable components are disclosed for generating a representation of flatness defects on a wafer. Data is received describing the thickness of the wafer at a plurality of points on a wafer divided into a plurality of sites. A reference plane is defined for each of the plurality of sites. For each of the sites, an upper plane and a lower plane are defined relative to the reference plane. A determination is made as to which of the plurality of points on the wafer represents a flatness defect by identifying which points are not disposed between the upper plane and lower plane. A representation is then generated depicting a location of each of the flatness defects on the wafer. In some embodiments, a single representation is generated depicting the location of flatness defects on a plurality of wafers.

12 Claims, 8 Drawing Sheets

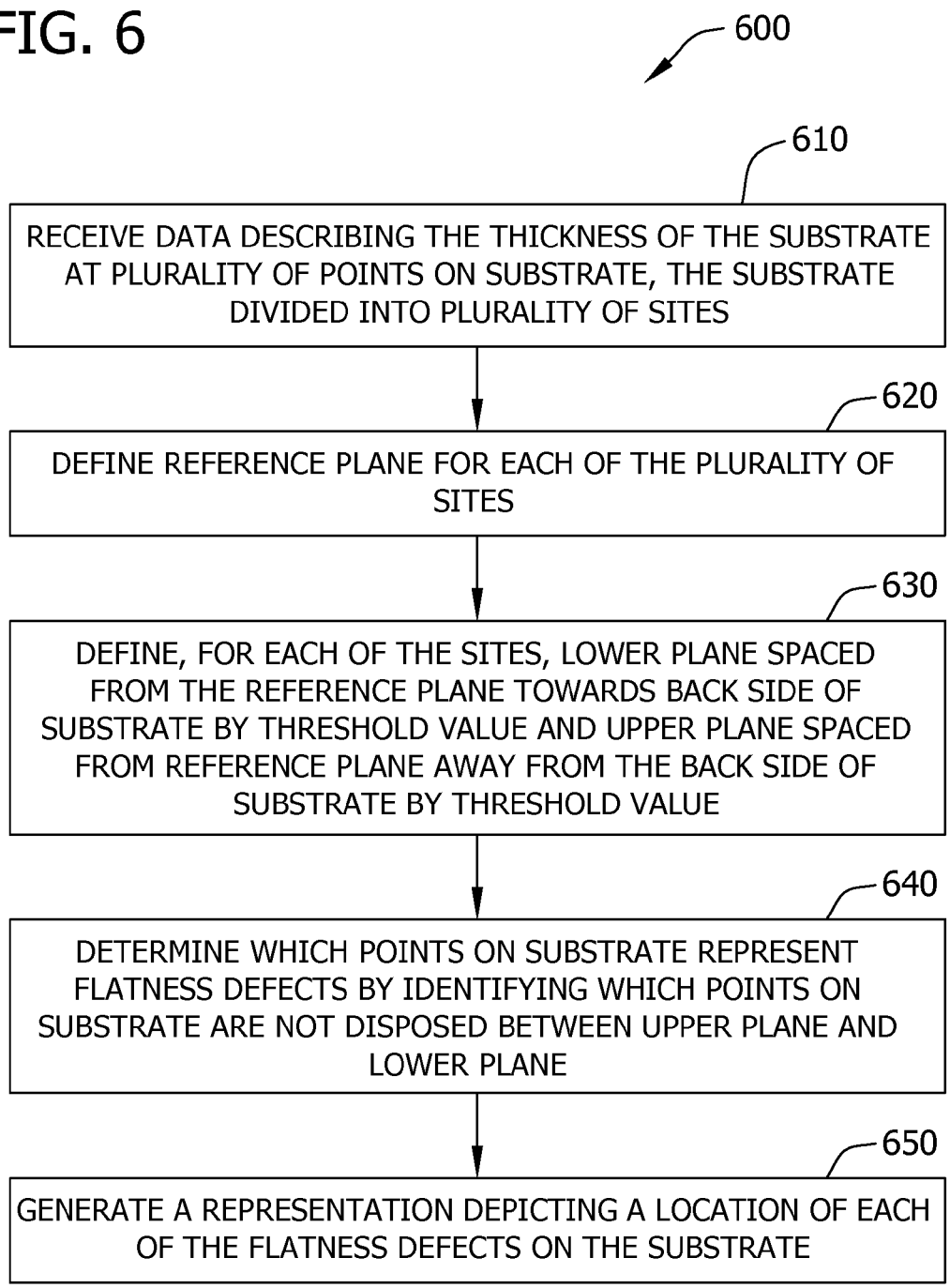

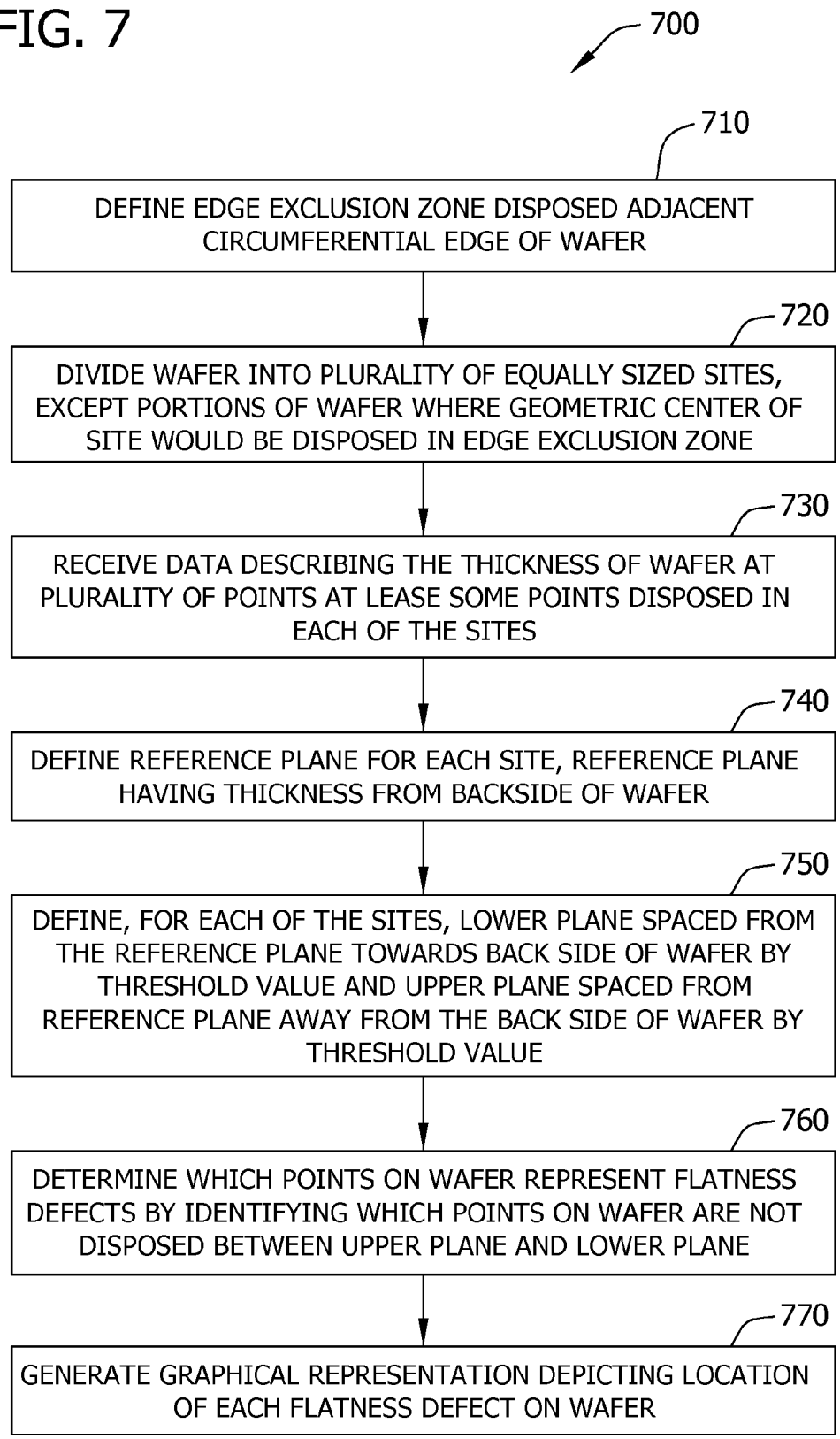

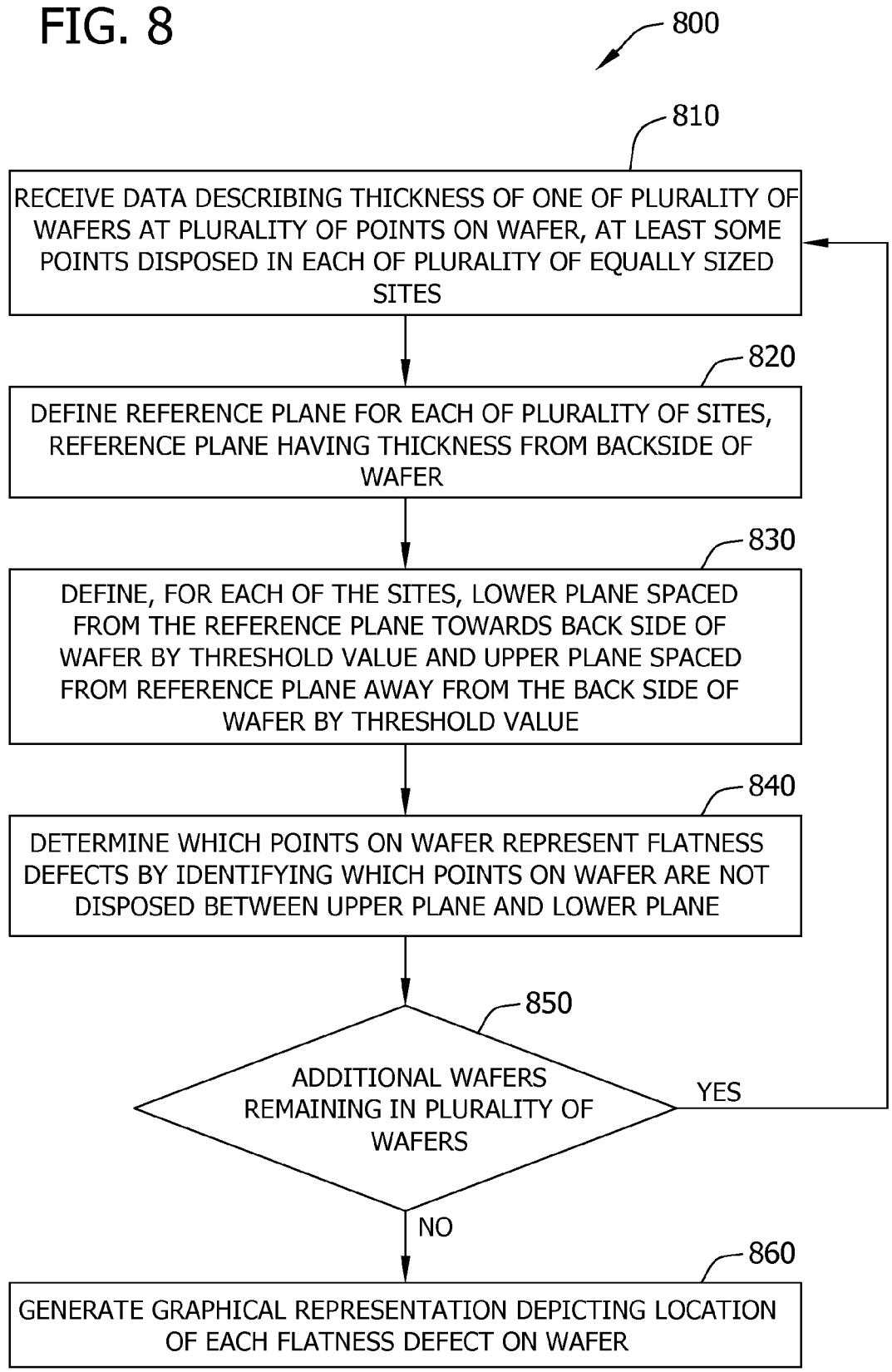

SYSTEMS FOR GENERATING REPRESENTATIONS OF FLATNESS DEFECTS ON WAFERS

BACKGROUND

Semiconductor wafers are often evaluated to identify flatness defects. Flatness defects of a wafer are defined as deviations of a front side of the wafer relative to a specified reference plane when the back surface of the wafer is ideally flat, such as when pulled down by a vacuum onto an ideally clean, flat chuck.

Typically, the front side of the wafer will be divided into equally sized sites prior to the analysis of the flatness of the surface. The flatness of each site is then evaluated using assorted methods. In an SFQR-type method (site flatness, least-squares reference plane), the flatness of an individual site on the front side of the wafer is measured against a least squares, best fit reference plane. For each site, the maximum and minimum deviations from the reference plane are calculated. Another method for evaluating that flatness of the wafer surface is SBIR (site flatness, back side referenced indicator runout). In SBIR-type methods, the reference plane is the ideally flat back surface of the wafer. The maximum and minimum deviations on the front side of the wafer for each site from the back surface of the wafer are calculated. The range of deviations calculated in the analysis of the flatness of the wafer are often used when evaluating the suitability of the wafer for down-stream applications (e.g., lithography or device fabrication).

BRIEF SUMMARY

One aspect is a system for generating a representation of flatness defects on a substrate. The system includes a memory area for storing an application program and a processor. The processor is programmed to receive data describing the thickness of the substrate at a plurality of points on the substrate. The substrate is divided into a plurality of sites. The processor defines a reference plane for each of the plurality of sites. For each of the sites, a lower plane and an upper plane are defined by the processor. The lower plane is spaced from the reference plane towards the back side of the substrate by a threshold value and the upper plane is spaced from the reference plane away from the back side of the substrate by the threshold value. The processor then determines which of the plurality of points on the substrate represents a flatness defect by identifying which of the plurality of points are not disposed between the upper plane and the lower plane. The processor then generates a representation depicting a location of each of the flatness defects on the substrate.

Another aspect is one or more computer-readable media having computer-executable components for generating a representation of flatness defects on a substrate. The components include an interface component that when executed by at least one processor causes the at least one processor to receive data describing the thickness of the substrate at a plurality of points on the substrate, the substrate divided into a plurality of sites. A first definition component is also included, that when executed by at least one processor, causes the at least one processor to define a reference plane for each of the plurality of sites. A second definition component is included, that when executed by at least one processor, causes the at least one processor to define, for each of the sites, a lower plane spaced from the reference plane towards a back side of the substrate by a threshold value and an upper plane spaced from the reference plane away from the back side of the substrate by the threshold value. A determination component is included, that when executed by at least one processor, causes the at least one processor to determine which of the plurality of points on the substrate represents a flatness defect by identifying which of the plurality of points are not disposed between the upper plane and the lower plane. The components also include a generation component, that when executed by at least one processor, causes the at least one processor to generate a representation depicting a location of each of the flatness defects on the substrate.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

FIG. 6 is a flow diagram showing a method of generating a representation of flatness defects on a substrate.

FIG. 7 is a flow diagram showing a method of generating a graphical representation of flatness defects on a wafer.

FIG. 8 is a flow diagram showing a method of generating a graphical representation of flatness defects on a plurality of wafers.

DETAILED DESCRIPTION

The embodiments described herein are generally directed to methods, systems, and computer-readable media having computer-executable components for the generation of a representation of flatness defects disposed on a single substrate or a plurality of substrates. While in the exemplary embodiment the substrate is a semi-conductor wafer, other types of substrates may be used without departing from the scope of the embodiments.

Figure 1:
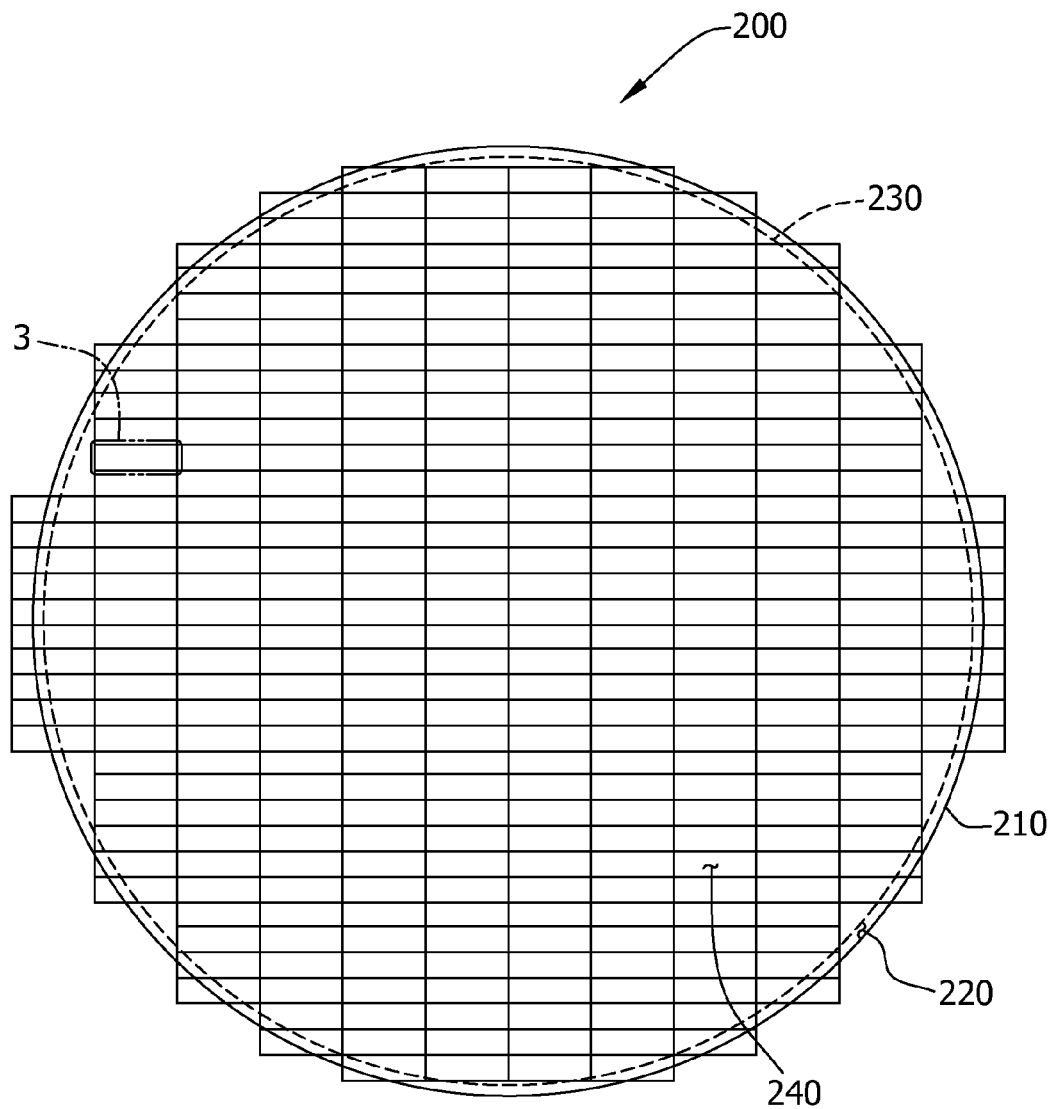
FIG. 1 is a top plan view of an exemplary wafer divided into a plurality of sites.
Figure 2:
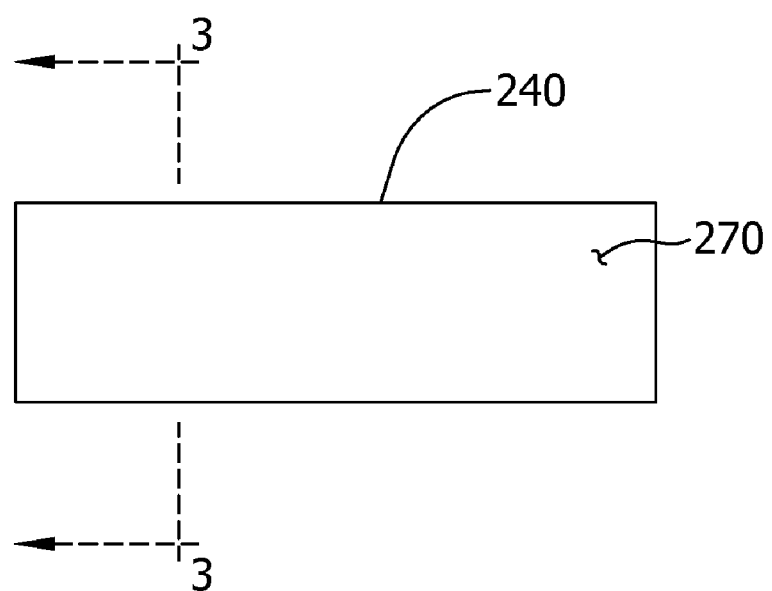
FIG. 2 is a top plan view of an exemplary site of the wafer of FIG. 2.

A top plan view of an exemplary wafer 200 is shown is shown in FIG. 1. The wafer 200 has a circumferential edge 210, a back side 260 (FIG. 3), and a front side 270 (FIG. 2). In the exemplary embodiment, the wafer 200 is a semiconductor wafer constructed from silicon. In other embodiments, the wafer 200 may be formed from other materials (e.g., germanium, gallium arsenide, or silicon carbide). In the exemplary embodiment, the wafer 200 has a diameter of 300 mm, while in other embodiments the wafer has a different diameter.

For the purposes of analyzing the front side 270 of the wafer 200 for flatness defects, the front side is divided into a plurality of equally sized sites 240. The sites 240 abut each other and in embodiments where the wafer has a diameter of 300 mm are generally 26 mm wide by 8 mm in length. In other embodiments the sites 240 may be 25 mm by 25 mm, 20 mm×20 mm, or 26 mm×32 mm, or any other suitable size. The dimensions of the sites 240 may be altered however, without departing from the scope of the embodiments. Portions of the wafer 200 where the sites 240 have a geometric center lying within an exclusion zone 220 are excluded from the placement of sites thereon. The exclusion zone 220 is a ring-shaped area disposed adjacent an outer periphery of the wafer 200 that is generally not used in the subsequent fabrication of devices from the wafer 200. As shown in FIG. 1, the exclusion zone 220 is disposed on the outer periphery of the front side 270 of the wafer 200. The boundaries of the exclusion zone 220 are defined by the circumferential edge 210 of the wafer 200 and an exclusion boundary 230. In wafers having a diameter of 300 mm, the diameter of the exclusion boundary 230 may be 294 mm, resulting in the exclusion zone 220 having a width of 3 mm. In other embodiments, the width of the exclusion 220 may less than or greater than 3 mm.

Figure 3:
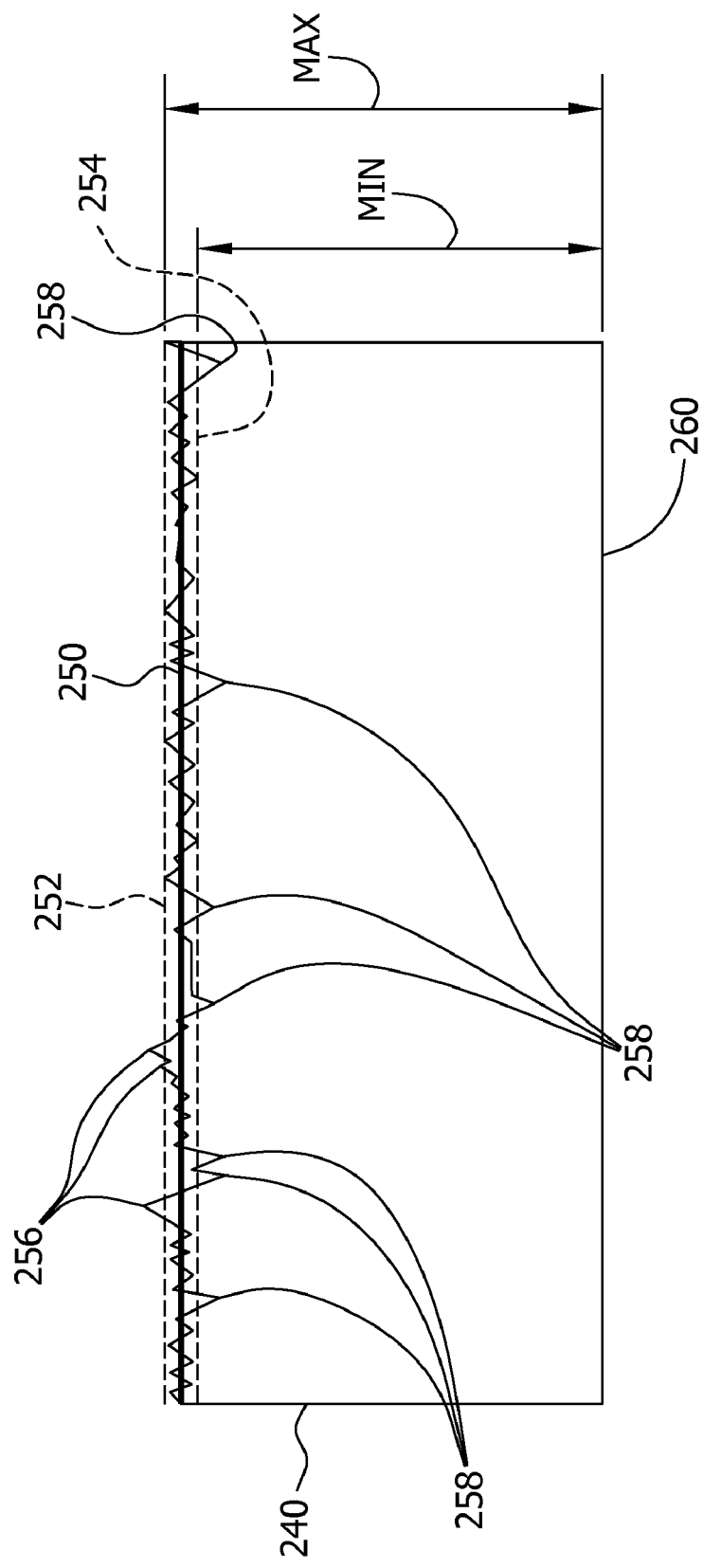
FIG. 3 is an enlarged view of a cross-section of FIG. 2 taken along the 3-3 line.

As shown in the exemplary embodiment of FIGS. 2 and 3, the thickness of the wafer 200 in one of the sites 240 varies. The variations in the thickness of the site 240 shown in FIG. 3 are greatly exaggerated for illustration. To analyze the front side 270 of the site 240 to determine the presence and corresponding location of flatness defects, a reference plane 250 for each site 240 is defined according to the methods described in FIGS. 5-8. According to some embodiments, the reference plane 250 is not parallel to the back side 260 of the wafer 200.

A threshold value (i.e., tolerance) is used to define an upper plane 252 and a lower plane 242, relative to the reference plane 250, for the thickness of the wafer 200, above or below which constitutes a flatness defect. According to the exemplary embodiment, the threshold value is 10 nm. According to some embodiments, the threshold value is selected based on the requirements of a subsequent user of the wafer 200 or the requirements of a downstream processing method that the wafer will later be subject. Moreover, if the wafer 200 is comparatively very flat, smaller threshold values may be used (e.g., less than 10 nm). Likewise, if the wafer 200 has poor flatness, it will be analyzed with larger threshold values (e.g., 25 nm to 50 nm). If a plurality of wafers 200 are being analyzed, a larger threshold value may be selected as well.

For example, as shown in FIG. 3 the upper plane 252 is spaced from the reference plane 250 away from the back side 260 of the wafer 200 by a distance equal to the threshold value. A lower plane 254 is spaced from the reference plane 250 towards the back side 260 of the wafer 200 a distance equal to the threshold value. Points on the front side 270 of the wafer 200 are classified as flatness defects when the points are not disposed between the upper plane 252 and lower plane 254. That is, points disposed within the upper plane 252 and lower plane 254 are not classified as flatness defects, while points lying above the upper plane or below the lower plane are classified as flatness defects. The upper points 256 on the front side 270 of the wafer 200 are disposed above the upper plane 252 and are thus classified as flatness defects. The lower points 258 on the front side 270 of the wafer 200 are disposed between the lower plane 252 and the back side 260 of the wafer and are thus classified as flatness defects.

The distance between the upper plane 252 and the back side 260 of the wafer 200 is referred to as a maximum thickness. Accordingly, the distance between the lower plane 254 and the back side 260 of the wafer 200 is referred to as a minimum thickness. The maximum thickness and minimum thickness may vary along different sections of each site 240 because the reference plane 250 may not be parallel to the back side 260 of the wafer 200.

Figure 4A:
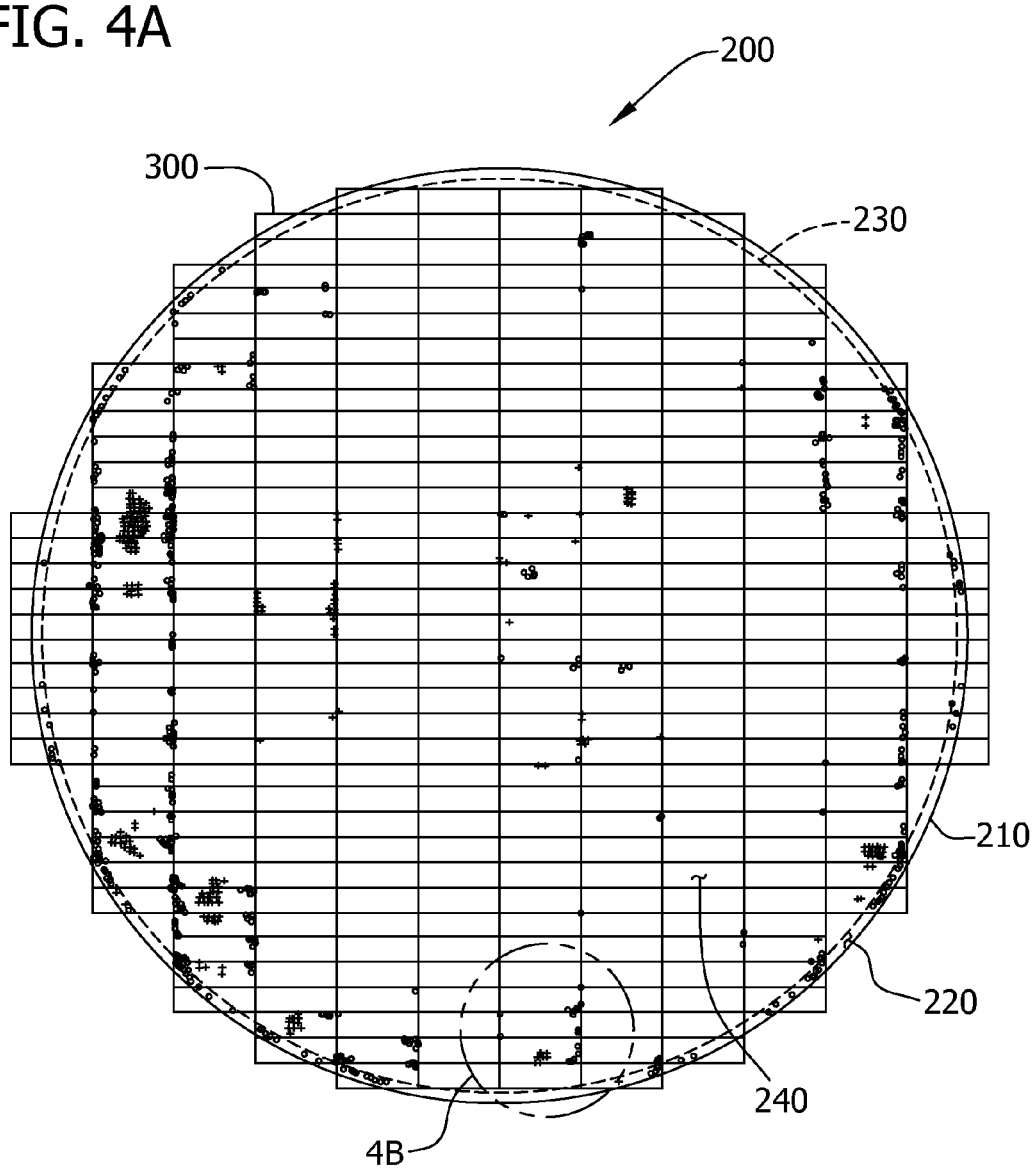
FIG. 4A is a top plan view of an exemplary representation of flatness defects on a wafer.
Figure 4B:
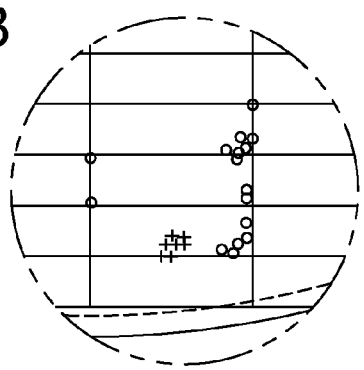
FIG. 4B is a top plan view of an enlarged portion of FIG. 4A.

FIGS. 4A and 4B are an example of a graphical representation 300 of flatness defects on the wafer 200. The graphical representation 300 of FIGS. 4A and 4B are generated according to any of the methods described below in FIGS. 6-9. The representation 300 depicts locations of flatness defects for a single wafer, although in other embodiments the representation may depict the location of flatness defects for a plurality of wafers.

In this embodiment, the representation 300 uses '+' symbols to represent points (i.e., positive deviations) on the wafer 200 that are flatness defects where the front side 270 is disposed above the upper plane 252. The representation 300 uses 'o' symbols to represent points (i.e., negative deviations) on the wafer 200 that are flatness defects where the front side 270 is disposed below the lower plane 254. In other embodiments, the representation 300 may use different colored symbols to represent positive deviations and negative deviations. For example, positive and negative deviations may both be represented by the same symbol, but with positive deviations colored red and negative deviations colored blue. Many other representations are also contemplated within the scope of this disclosure, such as pictorially differentiating between flatness defects for each wafer within a plurality of wafers. For example, the symbols used to represent positive deviations and negative deviations may be the same for each wafer, but the symbols are differently colored for each wafer (e.g., symbols for a first wafer are blue, symbols for a second wafer are green, etc.).

Figure 5:
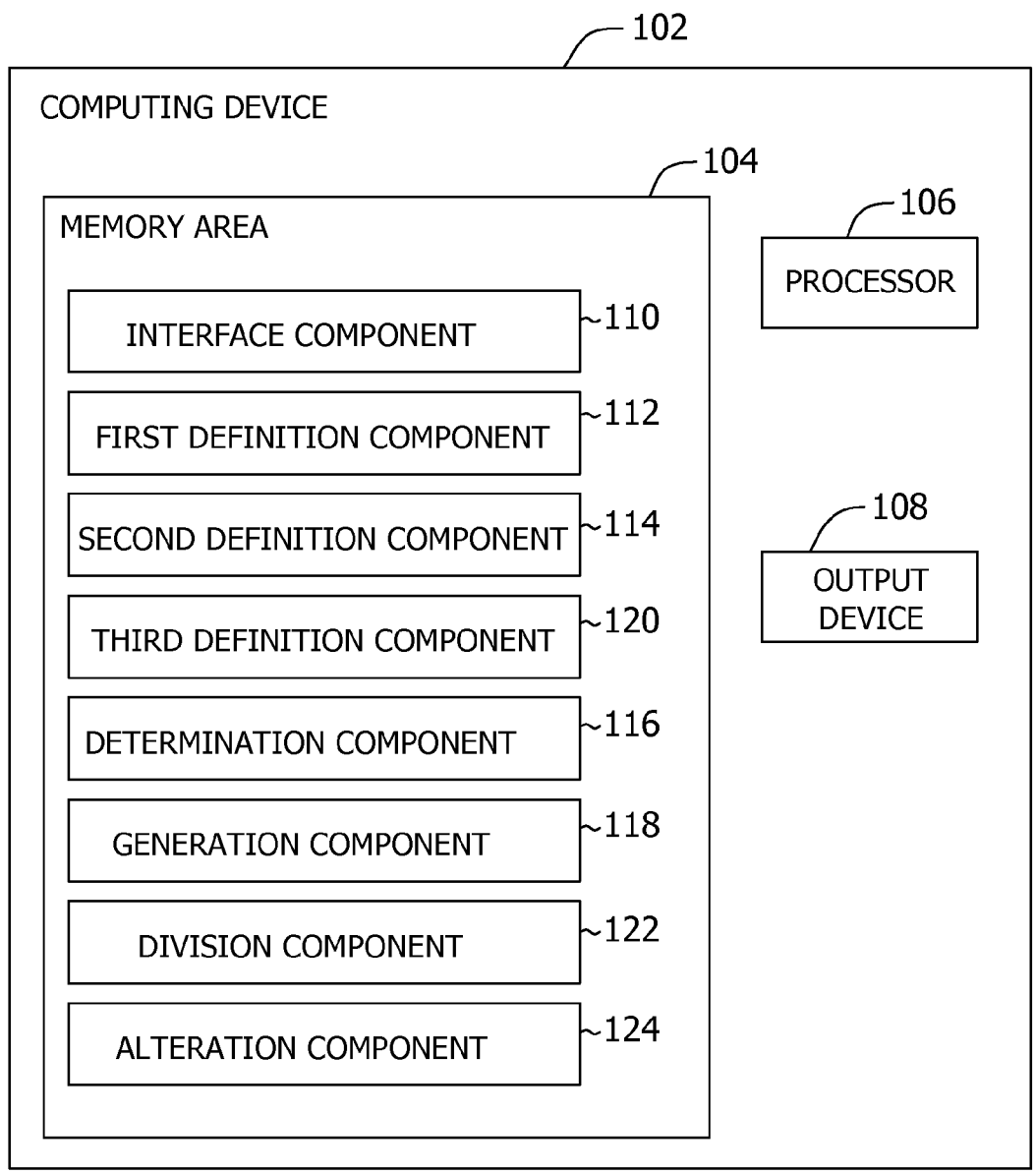
FIG. 5 is an exemplary block diagram illustrating a computing device for generating a representation of flatness defects on a substrate.

Referring to FIG. 5, an exemplary block diagram illustrates a computing device 102 for generating a representation of flatness defects on a wafer. The computing device 102 has a memory area 104, a processor 106, and an output device 108. The memory area 104, or one or more computer-readable media, further stores computer-executable components for generating a representation depicting the locations of flatness defects on wafers. Exemplary components include an interface component 110, a first definition component 112, a second definition component 114, a third definition component 120, a determination component 116, a generation component 118, a division component 122, and an alteration component 126. Each of the components, when executed by the processor 106, cause the processor to perform the functions further described below with reference to FIGS. 6-8.

In general, the memory area 104 is associated with the computing device 102. For example, in FIG. 5, the memory area 104 is within the computing device 102. However, the memory area 104 includes any memory area internal to, external to, or accessible by the computing device 102. Further, the memory area 104, or any of the data stored thereon may be associated with any server or other computer, local or remote from the computing device 102 (e.g., accessible via a network).

The processor 106 includes any quantity of processing units, and is programmed to execute computer-executable instructions for implementing aspects of the disclosure. The instructions may be performed by the processor 106 or by multiple processors executing within the computing device 102, or performed by a processor external to the computing device (e.g., by a cloud service). In some embodiments, the processor 106 is programmed to execute instructions such as those illustrated in the figures (e.g., FIGS. 6-8).

With reference now to FIGS. 5 and 6, a flow diagram depicts a method 600 of generating a representation of flatness defects on a substrate. The method 600 may be stored in the memory area 104 of the computing device 102 in the form of an application program. The processor 106 may thus be programmed to perform the steps of the method 600 described below. In other embodiments, each of the steps of the method 600 are performed by components stored in the memory area 104 of the computing device 102.

As described above, in the exemplary embodiment the substrate is a semiconductor wafer. The method 600 begins at block 610 with the receiving of data describing the thickness of the substrate at plurality of points on the substrate. The thickness of the substrate at the plurality of points is generally measured using one of two methods. In a first method, a pair of noncontact capacitance probes are scanned over the wafer, one on the front and one on the back. A second method, used in the exemplary embodiment, forms optical interference (i.e., fringe) patterns of the front and back of the wafer and applies an algorithm to convert those to surface shapes.

In some embodiments the interface component 110 receives the data. As described above, the substrate is divided into a plurality of equally sized sites. The received data includes the location of each of the plurality of points along with the thickness of the substrate at the point. The received data may also include the identity of the site within which each of the plurality of points lie. Alternatively, the received data may not include this information and instead each of the points may be associated with a site after they are received in block 610. In some embodiments, the edge exclusion zone adjacent the circumferential edge of the substrate is defined before the substrate is divided into the plurality of sites. The definition of the edge exclusion zone may be performed by the third definition component 120. The substrate is divided into the plurality of equally sized sites, except for portions of the substrate where a site would have a geometric center disposed in the edge exclusion zone. The substrate may be divided into the plurality of equally sized sites by the division component 122.

A reference plane is then defined in block 620 for each of the sites on the substrate. The reference planes are disposed a distance from the back side of the substrate. The reference planes may be tilted with respect to the back side of the substrate, and thus not parallel to the back side. In other embodiments, the reference planes may be parallel to the back side of the substrate. The first definition component 112 defines the reference plane for each of the plurality of sites in some embodiments. The reference plane is defined by applying an algorithm to the data received in block 610. In one embodiment, the algorithm is a least squares algorithm and the resultant reference plane is a best-fit plane based on the thickness of the points in that particular site on the substrate. According to embodiments using SFQR-type methods, the reference plane is a least-squares fit with three parameters (intercept, slope in the x direction, and slope in the y direction) determined for the thickness values of the points within the site. For SBIR-type methods, the reference plane is also a least-squares fit with a single parameter (intercept). In SBIR-type methods this results in the reference plane being parallel to the back surface of the substrate and disposed a distance away from the back side equal to the mean thickness of the points disposed in the site.

In block 630, a lower plane and an upper plane are defined for each of the sites on the substrate. The lower plane is spaced from the reference plane towards a back side of the substrate by a threshold value. The upper plane is spaced from the reference plane away from the back side of the substrate by the threshold value. The upper and lower planes are defined by the second definition component 114 in some embodiments.

A determination is made in block 640 as to which of the plurality of points on the substrate represents a flatness defect by identifying which of the plurality of points are not disposed between the upper plane and the lower plane. In some embodiments the determination component 116 determines which of the plurality of points on the substrate represents a flatness defect.

A representation is then generated in block 650 depicting a location of each of the flatness defects identified in block 640. According to some embodiments, the generation component 118 generates the representation depicting the location of each of the flatness defects on the substrate. The representation may be a graphical representation similar to that shown in FIG. 5 that pictorially differentiates between positive deviations and negative deviations of flatness defects in each site on the wafer. In some embodiments, a downstream substrate processing method (e.g., polishing, lapping, or etching) is altered based on the representation generated in block 650. The alteration of the downstream substrate processing method may be performed by the alteration component 124 in some embodiments. The altering of the processing method may include extending the duration of a processing step, reducing the duration of the processing step, eliminating the processing step, adding an additional processing step, or otherwise modifying the processing step.

FIG. 7 depicts another method 700 for generating a graphical representation of flatness defects on a wafer. The method begins at block 710 with definition of an edge exclusion zone adjacent the circumferential edge of the wafer. In some embodiments as described above in relation to FIGS. 2-5, the edge exclusion zone is a ring-shaped zone adjacent the circumferential edge of the wafer. The wafer is then divided into a plurality of equally sized sites in block 720. However, portions of the wafer where a geographic center of the site would be disposed in the edge exclusion site are not divided into sites.

At block 730, data is received describing the thickness of the wafer at a plurality of points on the wafer. At least some of the plurality of points are disposed in the sites into which the wafer was divided in block 720. The received data includes the location of each of the plurality of points along with the thickness of the wafer at the point. The received data may also include the identity of the site within which each of the plurality of points lie. Alternatively, the received data may not include this information and instead each of the points may be associated with a site after they are received in block 730.

A reference plane is then defined in block 740 for each of the sites on the wafer. The reference planes are disposed a distance from the back side of the wafer. The reference plane is defined by applying an algorithm to the data received in block 730. In one embodiment, the algorithm is a least squares algorithm and the resultant reference plane is a best-fit plane based on the thickness of the points in that particular site on the wafer.

In block 750, an upper plane and a lower plane is defined for each of the sites on the wafer. The lower plane is spaced from the reference plane towards a back side of the wafer by a threshold value. The upper plane is spaced from the reference plane away from the back side of the substrate by the threshold value.

A determination is then made in block 760 as to which of the plurality of points on the wafer represents a flatness defect by identifying which points are not disposed between the upper plane and the lower plane. A representation is then generated in block 770 depicting a location of each of the flatness defects identified in block 760. The representation may be a graphical representation similar to that shown in FIG. 5 that pictorially differentiates between positive deviations and negative deviations of flatness defects in each site on the wafer. In some embodiments, a downstream wafer processing method (e.g., polishing, lapping, or etching) is altered based on the representation generated in block 770. The altering of the processing method may include extending the duration of a processing step, reducing the duration of the processing step, eliminating the processing step, adding an additional processing step, or otherwise modifying the processing step.

In some embodiments, blocks 710 through 770 may be repeated for each of a plurality of wafers. The representations generated for each wafer in block 770 may then be merged into a single combined representation depicting the location of each of the flatness defects on all of the plurality of wafers.

FIG. 8 depicts a method 800 for generating a graphical representation of flatness defects on a plurality of wafers. The method begins at block 810 where data is received describing the thickness of one of the plurality of wafers at a plurality of points on the wafer. At least some of the plurality of points are disposed in each of a plurality of equally sized sites into which the wafer is divided. The received data includes the location of each of the plurality of points along with the thickness of the wafer at the point. The received data may also include the identity of the site within which each of the plurality of points lie. Alternatively, the received data may not include this information and instead each of the points may be associated with a site after they are received in block 810.

A reference plane is then defined in block 820 for each of the sites on the wafer. The reference planes are disposed a distance from the back side of the wafer. The reference plane is defined by applying an algorithm to the data received in block 810. In one embodiment, the algorithm is a least squares algorithm and the resultant reference plane is a best-fit plane based on the thickness of the points in that particular site on the wafer.

In block 830, an upper plane and a lower plane is defined for each of the sites on the wafer. The lower plane is spaced towards a back side of the wafer by a threshold value. The upper plane is spaced from the reference plane away from the back side of the substrate by the threshold value.

A determination is then made in block 840 as to which of the plurality of points on the wafer represents a flatness defect by identifying which points are not disposed between the upper plane and the lower plane. The method 800 then reaches decision block 850 where a determination is made if there are additional wafers remaining in the plurality of wafers that have yet to be analyzed for flatness defects. If there are wafers remaining in the plurality of wafers that have yet to be analyzed, the method returns to block 810. Alternatively, if there are not any wafers remaining in the plurality of wafers that have yet to be analyzed the method proceeds to block 860.

A representation is then generated in block 860 depicting a location of each of the flatness defects identified in block 840 for each of the plurality of wafers. The representation may be a graphical representation similar to that shown in FIG. 5 that pictorially differentiates between positive deviations and negative deviations of flatness defects in each site on the wafer. In some embodiments, a downstream wafer processing method (e.g., polishing, lapping, or etching) is altered based on the representation generated in block 860. The altering of the processing method may include extending the duration of a processing step, reducing the duration of the processing step, eliminating the processing step, adding an additional processing step, or otherwise modifying the processing step.

Exemplary Operating Environment

By way of example and not limitation, computer readable media comprise computer storage media and communication media. Computer storage media store information such as computer readable instructions, data structures, program modules or other data. Communication media typically embody computer readable instructions, data structures, program modules, or other data in a modulated data signal such as a carrier wave or other transport mechanism and include any information delivery media. Combinations of any of the above are also included within the scope of computer readable media.

Although described in connection with an exemplary computing system environment, embodiments of the invention are operational with numerous other general purpose or special purpose computing system environments or configurations. Examples of well known computing systems, environments, and/or configurations that may be suitable for use with aspects of the invention include, but are not limited to, mobile computing devices, personal computers, server computers, hand-held or laptop devices, multiprocessor systems, gaming consoles, microprocessor-based systems, set top boxes, programmable consumer electronics, mobile telephones, network PCs, minicomputers, mainframe computers, distributed computing environments that include any of the above systems or devices, and the like.

Embodiments of the invention may be described in the general context of computer-executable instructions, such as program modules or components, executed by one or more computers or other devices. The computer-executable instructions may be organized into one or more computer-executable components or modules. Generally, program modules include, but are not limited to, routines, programs, objects, components, and data structures that perform particular tasks or implement particular abstract data types. Aspects of the invention may be implemented with any number and organization of such components or modules. For example, aspects of the invention are not limited to the specific computer-executable instructions or the specific components or modules illustrated in the figures and described herein. Other embodiments of the invention may include different computer-executable instructions or components having more or less functionality than illustrated and described herein.

The embodiments illustrated and described herein as well as embodiments not specifically described herein but within the scope of aspects of the invention constitute exemplary means for creating the representation 300 depicted in FIG. 4 based on an identification of which points disposed on a front side of a wafer are flatness defects.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description and shown in the accompanying drawings shall be interpreted as illustrative and not in a limiting sense.

What is claimed is:

1. A system for generating a representation of flatness defects on a substrate, the system comprising:
   a memory area for storing an application program; and
   a processor programmed for:
   receiving data describing the thickness of the substrate at a plurality of points on the substrate, the substrate divided into a plurality of sites;
   defining a reference plane for each of the plurality of sites;
   defining, for each of the sites, a lower plane spaced from the reference plane towards the back side of the substrate by a threshold value and an upper plane spaced from the reference plane away from the back side of the substrate by the threshold value;
   determining which of the plurality of points on the substrate represents a flatness defect by identifying which of the plurality of points are not disposed between the upper plane and the lower plane; and
   generating a graphical representation depicting a location of each of the flatness defects on the substrate, wherein generating the graphical representation of the flatness defects includes differentiating in the graphical representation between points having flatness defects disposed between the lower plane and the back side of the substrate and points having flatness defects disposed above the upper plane.

2. The system of claim 1 further comprising generating a graphical representation of the flatness defects for a plurality of substrates.

3. The system of claim 1 further comprising, before the substrate is divided into a plurality of sites, defining an edge exclusion zone adjacent a circumferential edge of the substrate.

4. The system of claim 3 further comprising dividing the substrate into the plurality of equally sized sites except portions of the substrate where a site would have a geometric center disposed in the edge exclusion zone.

5. The system of claim 1 further comprising altering a substrate processing method based on the graphical representation depicting the location of each of the flatness defects on the substrate.

6. The system of claim 5 wherein the substrate is a semiconductor wafer.

7. One or more non-transitory computer-readable media having computer-executable components for generating a representation of flatness defects on a substrate, the components comprising:
   an interface component that when executed by at least one processor cause the at least one processor to receive data describing the thickness of the substrate at a plurality of points on the substrate, the substrate divided into a plurality of sites;
   a first definition component that when executed by at least one processor cause the at least one processor to define a reference plane for each of the plurality of sites;
   a second definition component that when executed by at least one processor cause the at least one processor to define, for each of the sites, a lower plane spaced from the reference plane towards a back side of the substrate by a threshold value and an upper plane spaced from the reference plane away from the back side of the substrate by the threshold value;
   a determination component that when executed by at least one processor cause the at least one processor to determine which of the plurality of points on the substrate represents a flatness defect by identifying which of the plurality of points are not disposed between the upper plane and the lower plane; and
   a generation component that when executed by at least one processor cause the at least one processor to generate a graphical representation depicting a location of each of the flatness defects on the substrate, and differentiate in the graphical representation between points having flatness defects disposed between the lower plane and the back side of the substrate and points having flatness defects disposed above the upper plane.

8. The non-transitory computer-readable media of claim 7 wherein the generation component further comprises generating a graphical representation of the flatness defects for a plurality of substrates.

9. The non-transitory computer-readable media of claim 7 further comprising a third definition component that when executed by at least one processor cause the at least one processor to define, before the substrate is divided into a plurality of sites, an edge exclusion zone adjacent a circumferential edge of the substrate.

10. The non-transitory computer-readable media of claim 9 further comprising a division component that when executed by at least one processor cause the at least one processor to divide the substrate into the plurality of equally sized sites except portions of the substrate where a site would have a geometric center disposed in the edge exclusion zone.

11. The non-transitory computer-readable media of claim 7 further comprising an alteration component that when executed by at least one processor cause the at least one processor to alter a substrate processing method based on the graphical representation depicting the location of each of the flatness defects on the substrate.

12. The non-transitory computer-readable media of claim 11 wherein the substrate is a semiconductor wafer.

* * * * *